United States Patent
Bisgaard (10) Patent No.: US 7,819,019 B2
(45) Date of Patent: Oct. 26, 2010

(54) WIND TURBINE TESTING SYSTEM

(75) Inventor: Jan Bisgaard, Viborg (DK)

(73) Assignee: Vestas Wind Systems A/S (DK)

( * ) Notice: Subject to any disclaimer, the term of this patent is extended or adjusted under 35 U.S.C. 154(b) by 47 days.

(21) Appl. No.: 12/348,230

(22) Filed: Jan. 2, 2009

(65) Prior Publication Data
US 2009/0107256 A1   Apr. 30, 2009

Related U.S. Application Data

(63) Continuation of application No. PCT/DK2007/000337, filed on Jul. 3, 2007.

(30) Foreign Application Priority Data

Jul. 3, 2006   (DK) ............................... 2006 00913

(51) Int. Cl.
*G01N 3/02* (2006.01)
(52) U.S. Cl. ........................................................ 73/856
(58) Field of Classification Search ........................ None
See application file for complete search history.

(56) References Cited

U.S. PATENT DOCUMENTS

| | | | | |
|---|---|---|---|---|
| 5,412,997 | A * | 5/1995 | Hu et al. ........................ | 73/827 |
| 5,753,799 | A * | 5/1998 | Shah .............................. | 73/40 |
| 6,862,940 | B2* | 3/2005 | Romano ....................... | 73/856 |
| 7,178,406 | B2* | 2/2007 | Gonzalez et al. ............. | 73/856 |
| 2005/0172729 | A1* | 8/2005 | Gonzalez et al. ............. | 73/856 |
| 2009/0107255 | A1* | 4/2009 | Jensen ........................... | 73/862 |
| 2009/0173148 | A1* | 7/2009 | Jensen ..................... | 73/116.03 |
| 2009/0259429 | A1* | 10/2009 | Elisiussen .................... | 702/113 |

FOREIGN PATENT DOCUMENTS

| EP | 0845666 A1 | 6/1998 |
|---|---|---|
| EP | 1564405 A1 | 8/2005 |

OTHER PUBLICATIONS

Hui Li et al, Development of a Unified Design, Test and Research Platform for Wind Energy System Based on Hardware-in-the-Loop Real-Time Simulation, IEEE Transaction on Industrial Electronics, vol. 53, No. 4, Aug. 2006, pp. 1144-1151, XP002456369 cited in the application, Chapter II, II.A, II.B, Chapter III.A, III.B, Fig. 4, 5, Chapter V.

International Search Report, Nov. 8, 2007 (2 pages).

National Renewable Energy Laboratory; "Wind Turbine Testing in the NREL Dynamometer Test Bed"; Presented at AWEA's Wind Power 2000 Conference in California, Apr. 30-May 4, 2000; 12 pages.

* cited by examiner

*Primary Examiner*—Andre J Allen
(74) *Attorney, Agent, or Firm*—St. Onge Steward Johnston & Reens LLC (57) ABSTRACT

A wind turbine testing system is disclosed for testing at least a part of the nacelle components of a wind turbine system when mounted on a load carrying structure of a nacelle, said wind turbine testing system comprising a test bench being arranged to hold said load carrying structure including said nacelle components, a grid simulation system comprising a power converter system and a simulation controller being arranged to be electrically coupled to at least one of said nacelle components and being adapted for providing a simulated utility grid on the basis of a power supply and at least one control signal established by said simulation controller, and a wind simulation system comprising a wind turbine shaft rotating means arranged to be coupled to a rotating part of said generator system or a generator-related system of a nacelle or a part of a nacelle located in said test bench.

20 Claims, 8 Drawing Sheets

WIND TURBINE TESTING SYSTEM

CROSS-REFERENCE TO RELATED APPLICATIONS

The present application is a continuation of pending International patent application PCT/DK2007/000337 filed on Jul. 3, 2007 which designates the United States and claims priority from Danish patent application PA 2006 00913 filed on Jul. 3, 2006, the content of which is incorporated herein by reference.

FIELD OF THE INVENTION

The invention relates to a wind turbine testing system for testing at least a part of the nacelle components of a wind turbine system.

BACKGROUND OF THE INVENTION

A general challenge related to wind turbines is when wind turbines are coupled to weak utility grids. A coupling to a weak grid may under some circumstances result in transfer of, e.g., transients, noise or voltage drops or peaks between the utility grid and a wind turbine coupled to the grid.

Testing the individual parts of a wind turbine system for the capability of complying with different grid conditions before the wind turbine system is shipped from the factory—often to very distant parts of the world—is, therefore, essential.

It is, however, not sufficient to make sure, that the electrical parts of the wind turbine system, such as the generator and the power frequency converter, are able to manage simulated grid conditions corresponding to what could be expected during operation of the wind turbine when they are tested as stand-alone units. This is due to the fact that the varying rotation speed of the drive train axis and the mechanical and electrical interactions between the different parts of the wind turbine nacelle have an important influence on the performance of the wind turbine system.

It is one of several objects of the invention to establish a system which is able to physically simulate a coupling between a wind turbine system and a grid or parts of a wind turbine system and a grid.

SUMMARY OF THE INVENTION

The present invention relates to a wind turbine testing system for testing at least a part of the nacelle components of a wind turbine including an electrical generator system, said nacelle components being mounted on a load carrying structure of a nacelle of said wind turbine system, said wind turbine testing system comprising
  a test bench being arranged to hold said load carrying structure of said wind turbine nacelle including said nacelle components,
  a grid simulation system comprising
    a power converter system and
    a simulation controller being arranged to be electrically coupled to at least one of said nacelle components and being adapted for providing
    a simulated utility grid on the basis of
    a power supply and
    at least one control signal established by said simulation controller, and
  a wind simulation system comprising
    a wind turbine shaft rotating means arranged to be coupled to a rotating part of said generator system or a generator-related system of a wind turbine nacelle or a part of a wind turbine nacelle located in said test bench.

An advantageous feature of the invention is that the characteristics of a wind turbine system or at least part thereof may be tested in a broad physically simulated environment in the sense that wind resulting inputs and grid resulting inputs may be evaluated in combination, thereby providing a unique opportunity to incorporate feedback to and from the grid in a realistic situation or a certain desired test situation.

The wind turbine testing system according to the provisions of the invention is in particular advantageous for wind turbine systems, such as nacelle, generator, power frequency converters, pitch control, etc., as such systems must be optimized for the purpose of avoiding decoupling from the grid due to deviations from the ideal outputs from the wind turbine system or the grid, so that such decoupling may in fact be avoided or at least be performed by a smooth decoupling.

Although the wind turbine system can comprise a complete wind turbine nacelle or only parts thereof, a generator must be comprised within the system being tested in order to test the interaction between the wind turbine system and a simulated grid.

The use of a test bench is advantageous in the sense that the test setup may be standardised and provide reproducible results.

The simulation controller of the grid simulation system may be one single unit or form part of a distributed simulation controller network. In a further embodiment the power converter system of the wind turbine testing system may be formed by the power inverter of a wind turbine to be tested. In other words, the power inverter may form a part of the external test setup or alternatively be established by the wind turbines own power inverter if such is present. According to a further embodiment, the power converter system of the grid simulation system may be established rather primitively by means of simple resistor(s) combined with an on/off switch controlled by the simulation controller, e.g., a manual switch.

The purpose of the wind simulation system is to establish resulting movement of moving parts of the wind turbine system as if the system was activated by wind.

The wind simulation system may relate to any parameter relevant to wind simulation, such as wind speed, temperature, turbulence, resulting torque of the rotating system, etc.

This wind simulating may be more or less sophisticated, but it is typically important that the resulting wind simulating relates at least somewhat to real conditions.

The shaft rotating means of the wind simulation system may, e.g., be torque or speed adapted to provide typical wind-resulting conditions as input to the nacelle by means of the rotating system.

The shaft rotating means may typically be mechanically coupled to a rotating part of the generator system or generator-related system, such as a hub or a gear box, in order to make a generator-related part rotate as if the wind turbine system was activated by certain wind conditions.

As for examples of the implementation of different simulated grid conditions, the skilled person is kindly referred to the detailed description of the present invention, particularly the discussion of FIGS. 7-12. Other examples of simulations of grid and wind conditions are disclosed in "Development of a unified design, test, and research platform for wind energy systems based on hardware-in-the-loop real time simulation", M. Steurer et al., Power Electronics Specialists Conference, 2004, PESC 04, 2004 IEEE 35$^{th}$ annual, Aachen, Germany.

In a preferred embodiment of the present invention, said test bench is arranged to hold a complete nacelle of said wind turbine system.

When used for testing the system before it is send off, it is advantageous to be able to test a complete assembled nacelle. Therefore, preferably a full-scale nacelle test bench is provided for testing and simulating varying mechanical, wind, and/or grid situations, etc. In this case, either a complete nacelle or one or more parts of it mounted on the load carrying structure, such as a generator, may be held or fixated mechanically sufficiently in order to allow the mechanical energy to be transferred from the wind simulation system to a rotatable part or movable part of the parts being tested.

In yet a preferred embodiment of the invention, said shaft rotating means comprises means for being mechanically connected to a low speed shaft of a wind turbine system.

In order to be able to simulate different wind conditions in the case where a gear box is included in the parts being tested, comprising means for being connected to a low speed shaft, which is connected to the input of the gear box, is advantageous.

In another preferred embodiment of the invention, said shaft rotating means comprises means for being mechanically connected to a high speed shaft of a wind turbine system.

In order to be able to simulate different wind conditions in the case where a gear box is not included in the parts being tested, comprising means for being connected to a high speed shaft, which is connected directly to the rotor of the generator, is advantageous.

In an embodiment of the invention, said simulated utility grid comprises means for being electrically coupled to a generator output transformer of said nacelle components.

In some wind turbine systems, the electrical interface between the generator and the (simulated) utility grid comprises a simple transformer instead of or in combination with a power frequency converter. Such a generator output transformer is provided for stepping up the typically less than 1 kV, such as 690 V, output from the generator to a higher voltage compatible with a subsequently coupled converter or grid, such as 3 kV or 30 kV. Therefore, the simulated utility grid of the present invention preferably comprises means for interfacing to such a generator output transformer.

In a preferred embodiment of the invention, said simulated utility grid comprises means for being electrically coupled to a power frequency converter of said nacelle components.

Some generator types, such as Doubly-Fed Induction Generators (DFIG) and synchronous multi-pole generators require some sort of frequency conversion to be included in the electrical coupling to a utility grid. Typically, this frequency conversion is performed by means of a power frequency converter. Therefore, the simulated utility grid of the present invention preferably comprises means for interfacing to such a power frequency converter. It should be emphasized that the invention relates as well to generator types, such as synchronous multi-pole generators, where all of the power is transferred between the generator and the utility grid through the power frequency converter, as to generator types, such as DFIG, where some of the power is transferred through the power frequency converter and some is transferred directly between the stator of the generator and the utility grid.

In a preferred embodiment of the invention, said power converter system is arranged to simulate different grid conditions in response to control signals from said simulation controller.

The control signals from the simulation controller may address any interesting and relevant grid conditions, such as faults, extremes, sudden or slow changes in frequencies, transients, etc., thereby enabling a robust testing and an advantageous way of optimising the performance of the wind turbine systems on site. Such tests may also result in significant improvement with respect to cost-efficiency as different parts of the wind turbine system may be tested "in vivo".

The control signals from the simulation controller may be designed for any desired simulation purpose and the signals may, e.g., relate to specific grid situations known to be of relevance to specific components of the system, thereby allowing relevant tests and optimisation of dedicated components, or the controller may, e.g., establish grid simulations for the purpose of verifying that the complete wind turbine system performs as expected, e.g., according to specific grid codes.

In a further preferred embodiment of the invention, said grid conditions comprise fault conditions, weak grid conditions and/or asymmetric grid conditions.

A weak grid may, e.g., be understood as the part of the grid, which under certain conditions may be influenced by coupled systems such as wind turbines.

Thus, the term weak grid may typically be used with respect to a grid where it is necessary to take voltage level and fluctuations into account because there is a certain risk that the values might exceed the requirements in standards. Weak grids may, e.g., relate to more remote or peripheral locations where the grid is designed for small loads. In connection with a wind turbine system, a weak grid may typically be a system where the amount of wind energy that can be absorbed is limited by the grid capacity and, moreover, where the grid under different conditions may transfer noise or undesired changes in level from one connection point to the grid coupled wind turbine system.

In yet a preferred embodiment of the invention, said grid conditions comprise voltage variations such as voltage drops, voltage dips or voltage increases, short-circuits such as short-circuits between ground and phases or short-circuits between two or more phases, $\cos(\phi)$ variations such as increase or decrease of reactive power to and/or from the grid, frequency variations of phases, current variations such as dips or increases, curve form variations of individual, some or all phases and any combination thereof.

Preferably, the grid simulation system is able to simulate substantially all different grid conditions including faults and extremes, which the wind turbine system might meet during operation, so that the performance of the wind turbine system under such conditions can be tested thoroughly before the wind turbine system is shipped to its site of operation.

In a preferred embodiment of the invention said grid conditions involve time varying grid conditions.

Preferably, the above mentioned range of grid conditions also includes grid conditions that vary over time. Time varying conditions or specific curve form emulation may be combined with any of the above-mentioned grid conditions.

In an embodiment of the invention, said power supply is provided by a utility grid.

Using a utility grid is one way of supplying the necessary power for the wind turbine testing system or a part of it. Evidently, any suitable power supply may be applied within the scope of the invention as long as the resulting simulations correspond to the intended grid and wind simulations.

In an embodiment of the invention, said power converter system comprises a switching semiconductor based converter.

A preferred way of implementing a power converter comprises a suitable number of switching semiconductors. The semiconductors may be controlled or hardware configured according to conventional converter techniques.

In an embodiment of the invention, said semiconductor based converter is a thyristor based converter.

The semiconductors may, e.g., comprise transistors or thyristors such as BPT (bipolar transistor), IGBT (insulated gate bipolar transistor), MCT (metal-oxide-semiconductor controlled thyristor), IGCT (insulated gate controlled thyristor) or GTO thyristor (Gate-Turn-Off). A presently preferred semiconductor is a GTO thyristor.

Evidently, the grid simulating system may be based on any switching component which is able to establish the desired grid conditions.

In an embodiment of the invention, said grid simulation system further comprises a grid input transformer coupled between said power supply and said power converter system.

Advantageously, a transformer is provided for establishing compatibility between the power supply, which may, e.g., be a utility grid at 30 kV, and the power converter of the grid simulation system operating at, e.g., 3 kV.

In an embodiment of the invention, said grid simulation system further comprises a grid output transformer coupled between said power converter system and said simulated utility grid.

In an embodiment where the grid simulation system provides a simulated utility grid at, e.g., 30 kV, the output of the power converter has to be stepped up from the typical operation level of the power converters around 2 or 3 kV.

In an embodiment of the invention, said wind turbine testing system further comprises a nacelle stress simulating system, a wind turbine system temperature simulating system, and/or a wind turbine system humidity simulating system.

Advantageously, different other physical conditions may be established in order to provide an even broader and more realistic physical simulation.

In another aspect of the invention, it relates to the use of a wind turbine testing system as described above to establish and evaluate feedback from at least a part of a wind turbine system under physically simulated wind conditions into a grid.

Establishing and evaluating feedback from the wind turbine system enables the skilled personnel performing the test to estimate whether the wind turbine system meets a given set of specified requirements under different wind conditions.

In a preferred embodiment of the invention, a wind turbine testing system as described above is used to establish and evaluate feedback from at least a part of a given wind turbine system under physically simulated wind conditions into a grid before shipping said wind turbine system from the factory, wherein said simulated wind conditions correspond to wind conditions known to be present at the specific site of operation of said given wind turbine system.

In order to improve the simulations, the wind conditions simulated by the wind simulation system may be correlated with conditions known to be present at specific sites with respect to, e.g., sudden change of wind speed, wind gusts, fluctuating wind direction, turbulence, wake effects, etc. Particularly, the simulated wind conditions can be correlated to the site of operation of the specific wind turbine system being tested if such site is known at the time of testing.

In yet a preferred embodiment of the invention, a wind turbine testing system as described above is used to establish and evaluate feedback from at least a part of a given wind turbine system under physically simulated climatic conditions into a grid before shipping said wind turbine system from the factory, wherein said simulated climatic conditions include wind conditions, temperature conditions and/or humidity conditions corresponding to climatic conditions known to be present at the specific site of operation of said given wind turbine system.

The simulations can be improved even further, if not only the simulated wind conditions but also other simulated climatic conditions are correlated with conditions known to be present at specific sites with respect to, e.g., temperature and humidity, etc. Particularly, the simulated climatic conditions can be correlated to the site of operation of the specific wind turbine system being tested if such site is known at the time of testing.

In an advantageous embodiment of the invention, a wind turbine testing system as described above is used to establish and evaluate feedback from at least a part of a given wind turbine system under different grid conditions.

Establishing and evaluating feedback from the wind turbine system enables the skilled personnel performing the test to estimate whether the wind turbine system meets a given set of specified requirements under different grid conditions.

In a further advantageous embodiment of the invention, a wind turbine testing system as described above is used to establish and evaluate the compliance of at least a part of a given wind turbine system to a set of grid codes before shipping said wind turbine system from the factory, wherein said set of grid codes corresponds to grid codes applying at the specific site of operation of said given wind turbine system.

Depending on the site of operation of a given wind turbine system, it is normally required to comply to a set of grid codes representing a number of requirements with regard to the response and reaction to certain specified grid conditions of a wind turbine system coupled to a utility grid.

A wind turbine system may be analysed, tested or verified according to different grid codes in a simulated "in vivo" situation, preferably with respect to both wind and grid conditions. The simulation controller may simulate any relevant grid code in an environment relevant to a specific analysis. In this way, a wind turbine system or a part of a wind turbine system may be tested in order to verify that the wind turbine reacts in compliance with specific grid codes. Particularly, the compliance of a wind turbine system to a set of grid codes applying at the site of operation of the specific wind turbine system can be tested if such site is known at the time of testing.

In yet a further advantageous embodiment of the invention, a wind turbine testing system as described above is used to establish and evaluate the compliance of at least a part of a given wind turbine system to a set of grid codes comprising requirements of the response of a wind turbine system to different grid conditions including voltage variations such as voltage drops, voltage dips or voltage increases, short-circuits such as short-circuits between ground and phases or short-circuits between two or more phases, $\cos(\phi)$ variations such as increase or decrease of reactive power to and/or from the grid, frequency variations of phases, current variations such as dips or increases, curve form variations of individual, some or all phases or combinations thereof.

Preferably, the set of grid codes with regard to which the compliance of a wind turbine system is tested should include substantially all different grid codes, that the wind turbine system might meet during operation, such grid codes covering grid conditions including faults and extremes, so that the compliance of the wind turbine system to all relevant grid codes can be tested thoroughly before the wind turbine system is shipped to its site of operation.

In yet a further aspect of the invention, it relates to a method of testing a least a part of the nacelle components of a wind turbine system when mounted on a load carrying structure of a nacelle of said wind turbine system by means of a wind turbine testing system comprising the steps of:

mounting said nacelle components onto a load carrying structure of a wind turbine nacelle,     placing said load carrying structure in a test bench of said wind turbine testing system,     coupling a shaft rotating means of a wind simulation system of said wind turbine testing system to a rotating part of a generator system or a generator-related system of said wind turbine nacelle,     coupling a simulated utility grid of a grid simulation system of said wind turbine testing system electrically to an electrical nacelle component,     rotating said rotating part of a generator system by means of said wind simulation system simulating different wind conditions,     exposing said nacelle component to different simulated grid conditions by means of said grid simulation system, and     establishing and evaluating feedback from said nacelle components under different simultaneously simulated wind and grid conditions.

Performing the steps of the above mentioned method enables the skilled personnel performing the test to estimate in a reliable and reproducible way whether the wind turbine system meets a given set of specified requirements under different wind and grid conditions.

In a preferred embodiment of the invention, it relates to a method of testing a least a part of the nacelle components of a wind turbine system when mounted on a load carrying structure of a nacelle of said wind turbine system by means of a wind turbine testing system comprising the steps of:

mounting said nacelle components in a wind turbine nacelle,     placing said wind turbine nacelle in a test bench of said wind turbine testing system,     coupling a shaft rotating means of a wind simulation system of said wind turbine testing system to a rotating part of a generator system or a generator-related system of said wind turbine nacelle,     coupling a simulated utility grid of a grid simulation system of said wind turbine testing system electrically to an electrical nacelle component,     rotating said rotating part of a generator system by means of said wind simulation system simulating different wind conditions,     exposing said nacelle component to different simulated grid conditions by means of said grid simulation system, and     establishing and evaluating feedback from said nacelle components under different simultaneously simulated wind and grid conditions.

Advantageously, a complete assembled nacelle can be placed in the test bench and all the components of the nacelle can be tested simultaneously by following the steps of the above mentioned method.

In yet a preferred embodiment of the invention, it relates to a method of testing as described above, wherein said wind turbine testing system comprises a wind turbine testing system according to the present invention.

It is advantageous to use a wind turbine testing system as described above for the test as described in the above mentioned method, because the wind turbine testing system is designed exactly for that purpose.

In a further preferred embodiment of the invention, it relates to a method of testing as described above, wherein said simulated grid conditions include fault conditions of a utility grid.

In order to make the test performed according to the above mentioned method as complete as possible, it should include substantially all grid conditions that a wind turbine system could be expected to meet during operation.

BRIEF DESCRIPTION OF THE DRAWINGS

Some embodiments of the invention will now be described with reference to the figures, where.

DETAILED DESCRIPTION OF THE INVENTION

Figure 1:
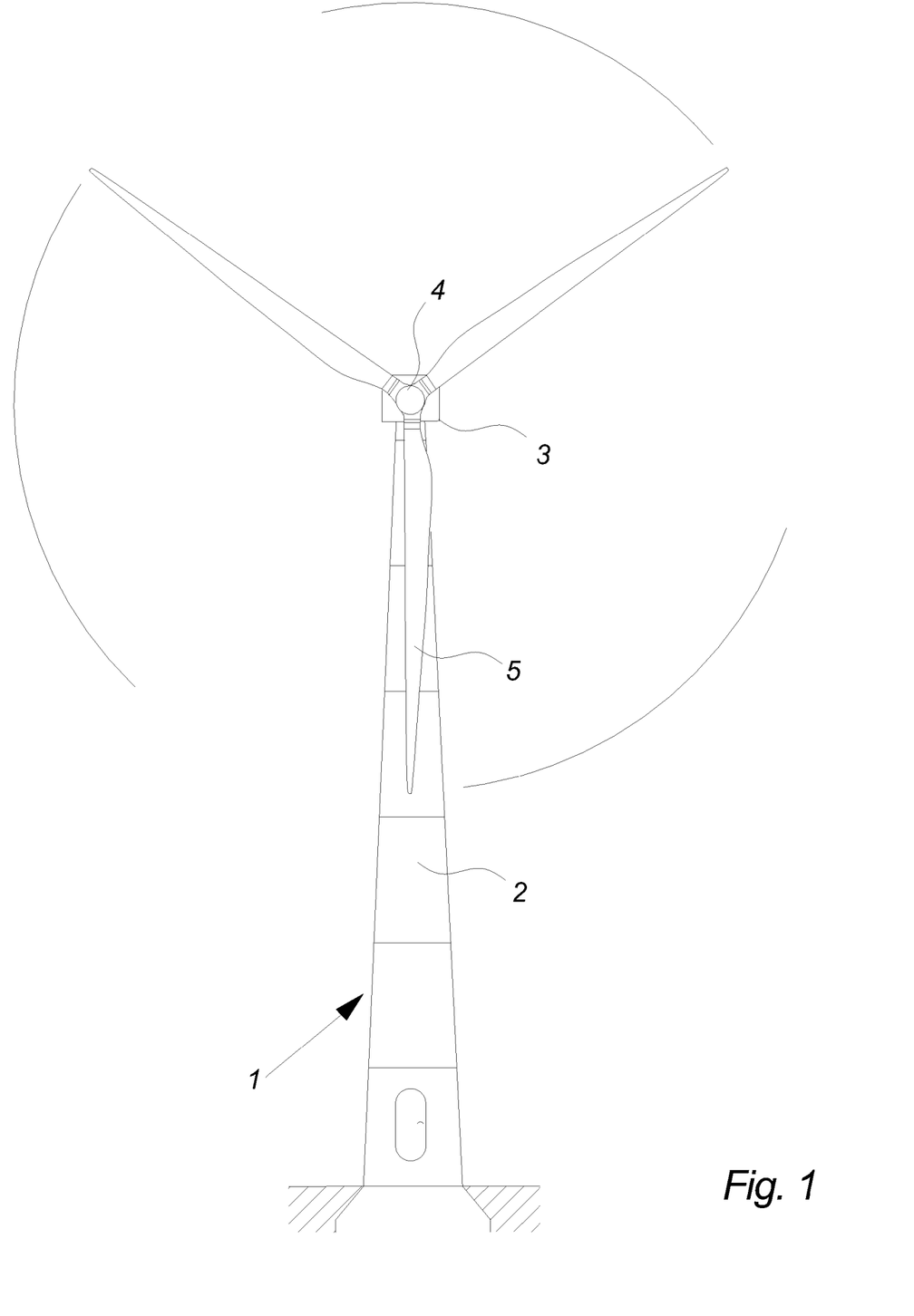
FIG. 1 illustrates a large modern wind turbine known in the art as seen from the front.

FIG. 1 illustrates a modern wind turbine 1 comprising a tower 2 placed on a foundation and a wind turbine nacelle 3 positioned on top of the tower 2. The wind turbine rotor 4, comprising three wind turbine blades 5, is connected to the nacelle 3 through the low speed shaft which extends out of the front of the nacelle 3.

Figure 2:
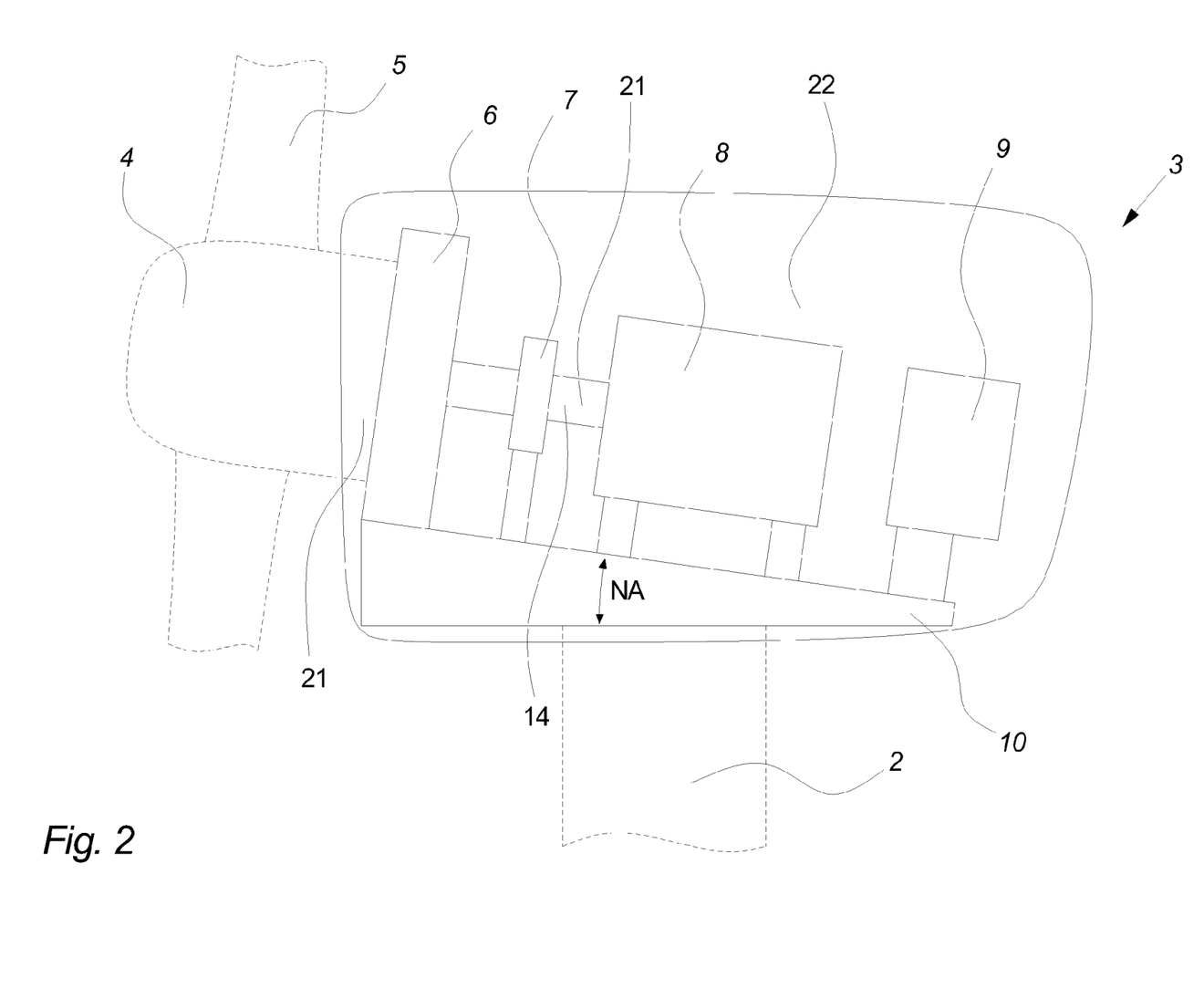
FIG. 2 illustrates a cross section of an embodiment of a simplified nacelle known in the art as seen from the side.

FIG. 2 illustrates a simplified cross section of a nacelle 3 as seen from the side. Nacelles 3 exist in a multitude of variations and configurations but in most cases the drive train 14 in the nacelle 3 comprises one or more of the following components: a gear 6, a coupling (not shown), some sort of braking system 7 and a generator 8. A nacelle 3 of a modern wind turbine 1 can also include a power frequency converter 9 (also called an inverter) and additional peripheral equipment such as further power handling equipment, control cabinets, hydraulic systems, cooling systems and more.

The weight of the entire nacelle 3 including the nacelle components 6, 7, 8, 9 is carried by a load carrying structure 10. The components 6, 7, 8, 9 are usually placed on and/or connected to this common load carrying structure 10. In this simplified embodiment, the load carrying structure 10 only extends along the bottom of the nacelle 3, e.g., in form of a bed frame to which some or all the components 6, 7, 8, 9 are connected. In another embodiment, the load carrying structure 10 could comprise a gear bell 11 transferring the load of the rotor 4 to the tower 2, or the load carrying structure 10 could comprise several interconnected parts such as latticework. In this embodiment of the invention, the drive train 14 is established in a normal operation angle NA of 8° in relation to a plane perpendicular to the centre axis through the tower 2.

Figure 3:
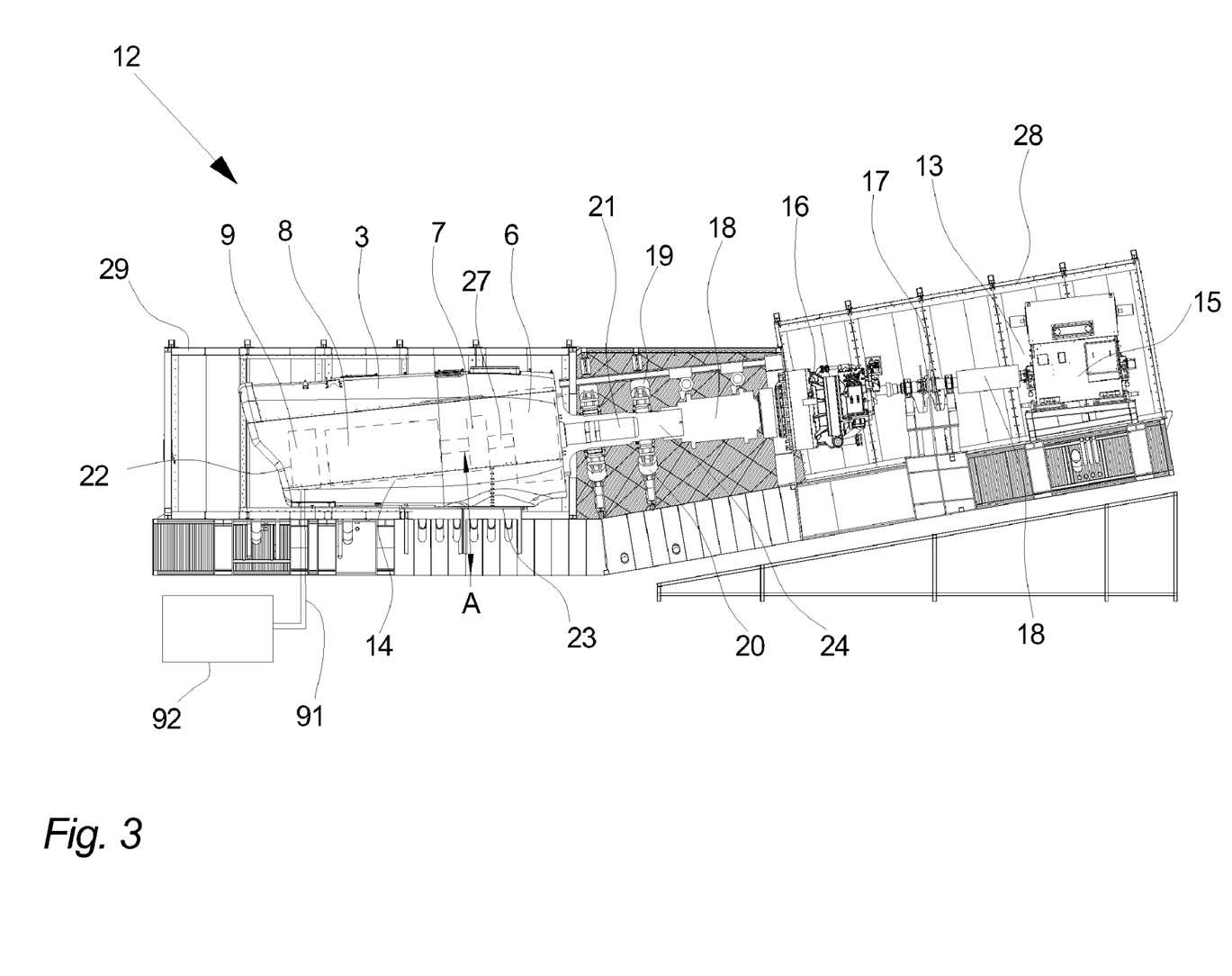
FIG. 3 illustrates a test bench for a nacelle according to an embodiment of the invention.

FIG. 3 illustrates a partial cross-section of a test bench 12 forming a part of a wind turbine testing system testing a wind turbine nacelle 3 as seen from the side. Evidently, the illustrated test bench 12 forms only one of several different possible configurations of such a test setup within the scope of the invention.

In this embodiment of the invention, the test bench 12 comprises drive means 13 in the form of an electric motor 15 and a gear 16 between which a braking system 17 and a flexible coupling 18 are positioned.

The output shaft of the test bench gear 16 is connected to a flexible coupling 18 of the test bench 12, which is connected to load applying means of the test bench 12 in the form of radial load means 20, which will be described more thoroughly under the description of FIG. 4.

The radial load means 20 comprising a shaft adapter 24 are connected to an input shaft 21 of a nacelle 3, which in this case is the input shaft 21 of a wind turbine gear 6, which via a brake system 7 and coupling (not shown) is connected to a generator 8 inside the nacelle 3. In this embodiment, the nacelle 3 further comprises a power frequency converter 9. The power frequency converter comprises an electrical interface 91 to a grid simulation system 92. Basically, the wind turbine nacelle 3 may be interfaced to a grid by any suitable power transferring system comprising the relevant components for the specific application. Such components may, e.g., comprise a combination of one or more transformer(s), frequency converter(s), rectifiers, power buffers, power cables, etc.

In this embodiment, the wind turbine equipment—in form of the drive train components 6, 7, 8 connected to each other by the high-speed output shaft 27 from the gear box 6 in the nacelle 3—is positioned in an angle A of 6° in relation to a horizontal plane, in that the tower connection flange 23 of the nacelle 3 is rigidly connected to a substantially horizontal connection flange of the test bench 12. Since the nacelle 3 in real life would be connected to a substantially horizontal connection flange at the top of a wind turbine tower 2, this angle A corresponds to the angle NA of these specific drive train components when positioned in an ordinary operating wind turbine 1.

In another embodiment of the invention, the connection flange of the test bench 12 could be angled in relation to a horizontal plane, or the entire test bench 12 could be angled or comprise means for controlling the angle of the test bench 12 and/or the tested equipment 22.

In another embodiment of the invention, the connection flange of the test bench 12 could also comprise means 19 for providing load to the equipment in order to increase the efficiency and/or realism of the test. Such load applying means 19 could for instance apply loads to a yaw mechanism (not shown) of a wind turbine 1, the load carrying structure 10 of a nacelle 3 or the input shaft 21, or it could apply loads to the tested equipment 22 in any other way.

In this embodiment of the invention, the radial load means 20 are at least in principle the only load applying means 19 of the test bench 12 applying direct load to the input shaft 21 of the tested equipment 22. In another embodiment, however, the test bench 12 could further comprise load applying means 19 for applying load to the input shaft 21 of the equipment 22 or any other part of the equipment 22 in any feasible direction such as axially, diagonally or from varying directions.

In a preferred embodiment of the invention, the generator 8 in the nacelle 3 is connected to the grid simulating system 92 enabling the generator 8 to act indirectly as a load applying means 19 of the test bench 12 during the test, in which it is possible to simulate different grid situations such as extreme overload situations, fault situations, short circuits, asymmetric phase amplitude and angle or other either independently or co-operating grid situations. The different situations of the grid will, thereby, indirectly apply different load situations on the tested equipment 22 through the generator 8.

In another embodiment, the generator 8 could simply be connected to the utility grid in the same way as it would be in an operating wind turbine 1.

In this embodiment of the invention, the test bench 12 comprises noise reducing means 28 in the form of a sound absorbing box 28 substantially enclosing the drive means 13 of the test bench 12, hereby enabling that the noise produced by particularly the drive means 13 are absorbed by the box 28, hereby reducing the noise emission from the test bench 12.

In another embodiment, the entire test bench 12 could be enclosed by a sound absorbing box 28 or the individual parts of the test bench 12 producing noise could be individually equipped with noise reducing means 28. In this embodiment, the noise reducing means 28 are passive but, in another embodiment, the means 28 could be active, e.g., by providing noise in anti-phase or in other ways.

In this embodiment of the invention, the test bench 12 further comprises climate controlling means 29 in form of a climate box 29 substantially enclosing the wind turbine equipment 22 or at least a part of the equipment 22 to be tested on the test bench 12.

In this embodiment, the climate box 29 enables that the temperature inside the box 29 can be adjusted and controlled freely between −45° C. and 55° C. when the tested equipment 22 is inactive and not operating, and between −40° C. and 90° C. during operation of the tested equipment 22. These temperature ranges are sufficient in the present embodiment of the invention to provide an efficient and/or realistic environment for the tested equipment 22, but in another embodiment, the test bench 12 could comprise means for controlling the ambient temperature of the equipment 22 within different ranges, and the climate controlling means 29 could further comprise means for controlling other climate parameters such as the humidity and/or the air pressure.

Figure 4:
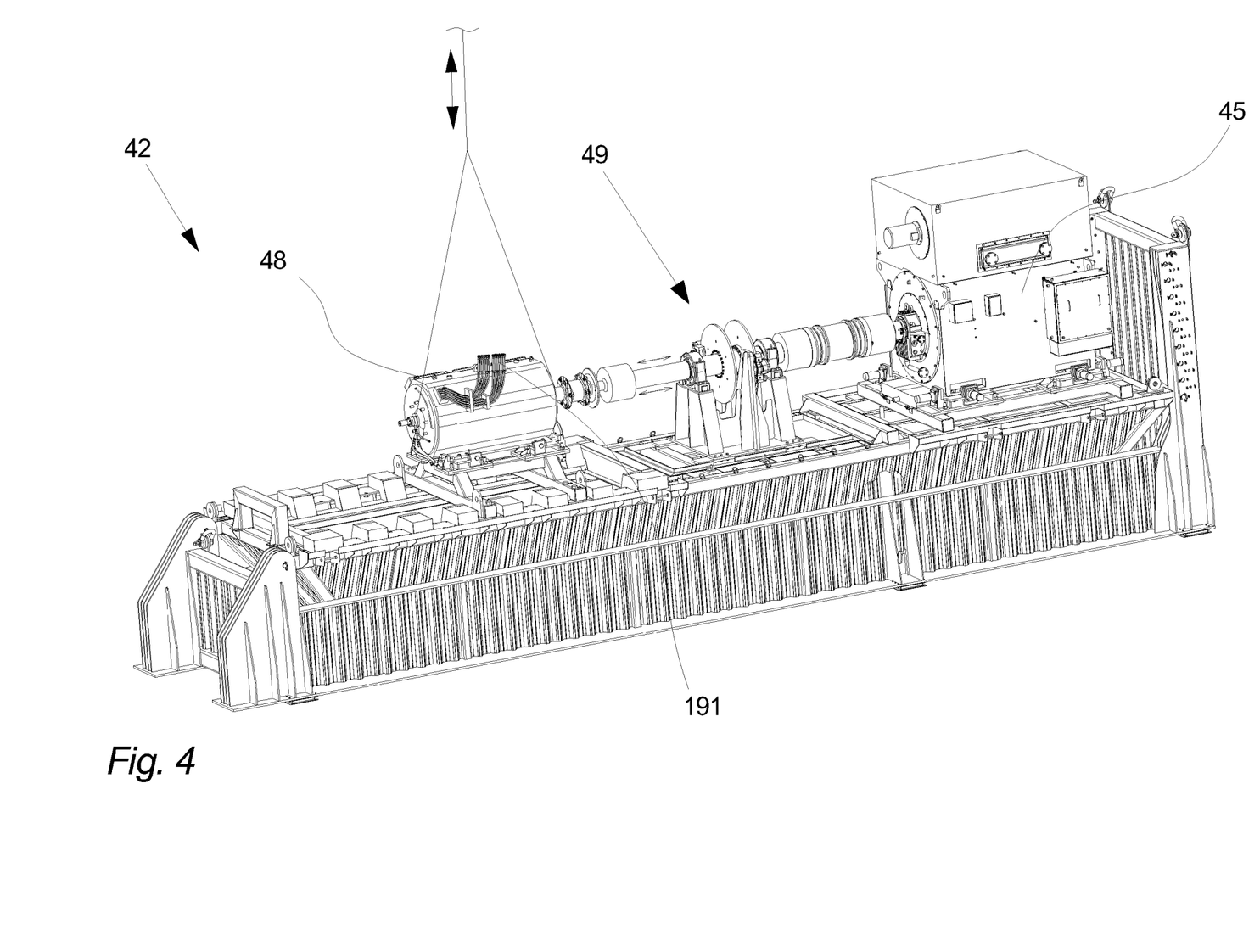
FIG. 4 illustrates a test bench for a generator according to an embodiment of the invention.

FIG. 4 illustrates a variant of a wind turbine testing system according to a further embodiment of the invention. In this embodiment, the wind turbine testing system is coupled to only a part of a wind turbine system, namely a wind turbine generator 48 as seen in perspective.

In this embodiment, a test bench 42 is in a substantially horizontal position when the wind turbine generator 48 is lifted onto and rigidly connected to the bench 42.

A wind simulation system 45 comprising an electrical motor is driven to establish desired physical conditions. The wind simulation system 45 transfers rotation to the generator 48 by means of a mechanical coupling 49, and the complete test bench 42 may be tilted to simulate further desired conditions physically.

The wind turbine testing system further comprises an electrical interface 191 to a grid simulation system (not shown) enabling coupling of the generator to a simulated grid.

Figure 5:
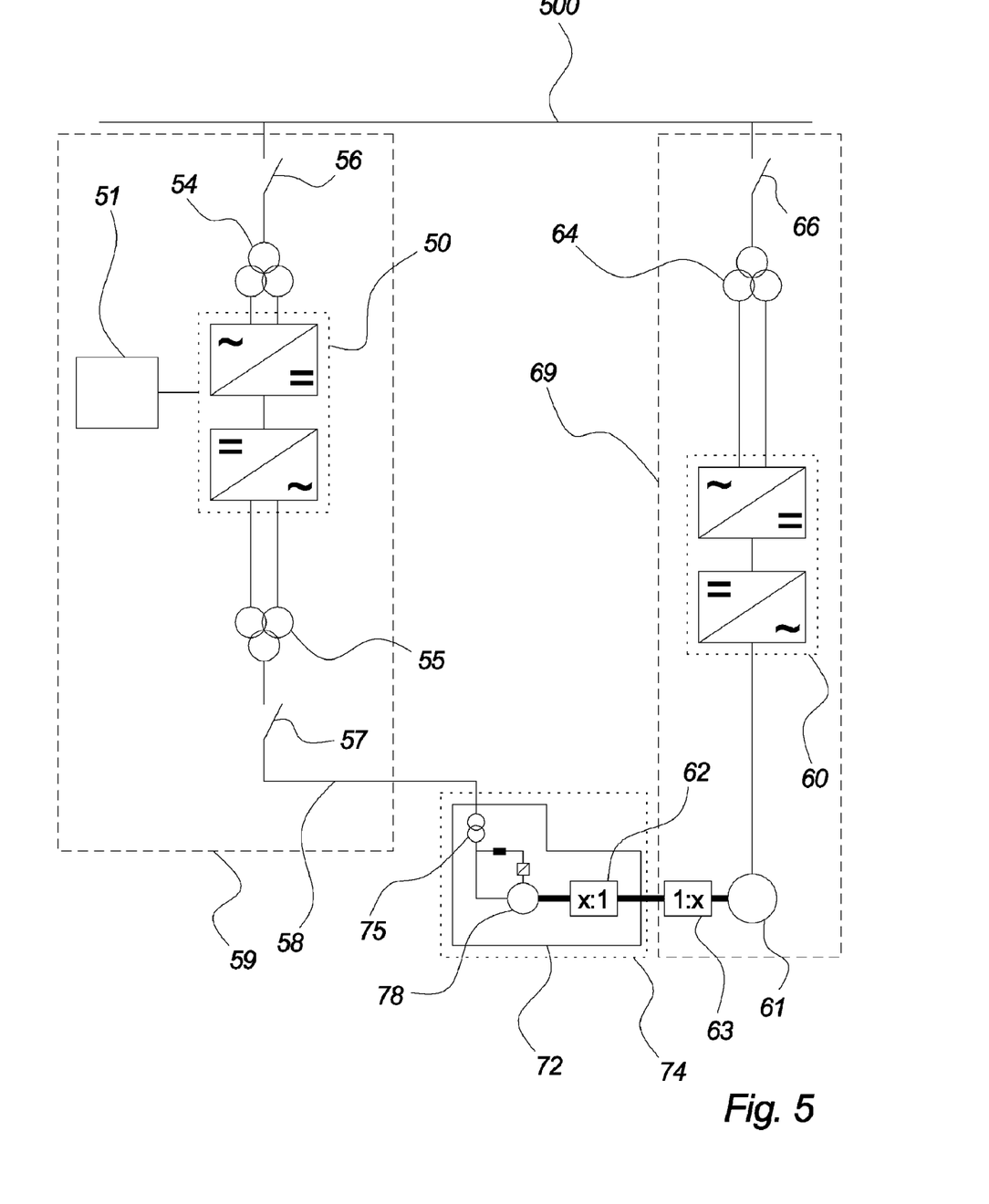
FIG. 5 illustrates a schematically represented grid simulating system test setup.

FIG. 5 illustrates a schematically represented electrical diagram of a wind turbine testing system according to one of several embodiments within the scope of the invention.

The illustrated embodiment comprises a grid simulation system 59 and a wind simulation system 69 mutually coupled via a wind turbine system 74. In this present embodiment, the wind turbine system comprises a nacelle 72 or nacelle parts.

The grid simulation system 59 and the wind simulation system 69 are both coupled to a power supply, such as the utility grid 500. Evidently, the simulating systems may be supplied from two different power supplies.

The grid simulating system 59 comprises a power converter 50 controlled by a simulation controller 51. The simulation controller 51 controls the power converter 50 to establish the intended grid simulation at the output of the grid simulating system 59. The power converter 50 is coupled to the utility grid 500 via a transformer 54 and a switch 56, and it is furthermore coupled to the wind turbine system 74 via a transformer 55, a switch 57 and an electrical interface 58.

The illustrated power converter 50 may, e.g., comprise an ALSPA VDM 7000 medium voltage inverter, the illustrated switches 56, 57 may, e.g., comprise 30 kV/50 Hz switches, the transformer 54 may, e.g., comprise a three-phase 13 MVA 30 kV/3.1 kV transformer, and the transformer 55 may, e.g., comprise a three-phase 13 MVA 3.1 kV/30 kV transformer.

The illustrated wind turbine system 74 comprises a nacelle 72 comprising a mechanical transmission 62, such as a gear box, connected to a generator 78 of the nacelle 72. The generator may, e.g., be electrically coupled to the electrical interface 58 via a generator output transformer 75 such as a simple transformer or a power frequency converter depending on the type of the tested wind turbine system 74. The coupling must match the effective output of the grid simulating system 59, here the output of the transformer 55. In the embodiment of FIG. 5, the generator output transformer 75 is shown as a simple transformer, whereas in the embodiments of FIGS. 2 and 3 are shown a power frequency converter 9.

Thus, the grid simulation system 59 may be established to provide a grid simulated output which may be fed directly into a wind turbine system 74 comprising a power converter 9 or, e.g., to a wind turbine system 74 only comprising a generator output transformer 75 as illustrated in the present embodiment. The illustrated generator output transformer 75 transforms the output of the generator 78 of the nacelle 72 of, e.g., about 690 V to 30 kV.

The wind simulation system 69 is basically established for providing a situation at the mechanical input of the nacelle 72 corresponding to certain wind conditions. The wind simulation system 69 comprises a frequency converter 60 connected to a motor 61 and thereby controlling the same. The motor 61 is mechanically and rotatable coupled to the nacelle 72 via a gear 63 providing a slow high-torque rotation.

The frequency converter 60 is here coupled to the utility grid 500 via a transformer 64 and a switch 66. The transformer 64 may, e.g., comprise a 13 MVA 30 kV/3.1 kV transformer.

The illustrated frequency converter 60 may, e.g., comprise an ALSPA VDM 7000 medium voltage inverter.

For reference to FIGS. 3 and 4, the grid simulation system 59 and the wind simulation system 69 of the wind turbine testing system may preferably be parts of the test benches 12, 42 shown in FIGS. 3 and 4, where main parts comprise the motor 61, which may correspond to the motor 15 of FIG. 3 or the motor 45 of FIG. 4, and the gear 63, which may correspond to the gear 16 of FIG. 3. In the small-scale test bench of FIG. 3, where, e.g., a generator 8 is tested separately from the rest of the nacelle components, no gear 6 is required, so far as the motor and gear are compatible. Also, in an embodiment, the grid simulating system 59 and electrical interface 58 may correspond to the grid simulating system 92 and electrical interface 91 of FIG. 3.

The illustrated embodiment facilitates testing of the nacelle 72 in a broad simultaneous physical simulation covering both a simulation of the grid and the wind. Evidently, further parameters may be included in the test setup, such as temperature, humidity, mechanical stress, tilting, etc. of an individual component of a wind turbine system or all or most of them in combination.

The control of the illustrated test setup may be established in several different ways depending on the purpose of the simulation, and the test results may be measured with different test methods at different measure points of the wind turbine testing system.

It should be noted that the illustrated grid simulating system may also be comprised by more simple or primitive contact systems with or without associated transforming circuitry, such as arrangements of switches and/or resistors or other loads, e.g., for establishing a voltage dividing circuit for simulating voltage drops. Such simulating systems would typically be suitable for testing very specific, typically only a few, grid conditions.

The power converter(s) may be self-commutated converters as well as externally controlled converters. In a preferred embodiment of the invention, the converter circuit is a thyristor converter circuit, converting the power from AC to DC and again to AC, giving an advantageous possibility of controlling a plurality of parameters. In another embodiment of the invention, the converter system may also be a direct AC converter or other types of converters or units with the functionality of a converter known to a person skilled in the art. The converters may further be manually clocked, self-clocked, grid-clocked, load-clocked, machine-clocked or the like. By controlling the converter circuits, it is possible to control a plurality of parameters, giving the possibility of simulating a plurality of different scenarios, such as grid faults, grid variations, different grid codes, variations of the wind turbine or the like.

Simulations concerning grid codes, grid stability and the like are powerful tools for optimisation of the wind turbine parameters. It is possible to use the power converters to simulate different kinds of voltage drops or increases on the grid, short circuits between ground and phases, short circuits between two phases, short circuits between three phases, reactive compensation, frequency variations, different phase angles, different amplitude curve forms, and other different relevant simulations. Furthermore, it is possible to simulate and identify different time periods concerning different scenarios.

By placing different sensors, such as accelerometers, heat sensors, acoustic sensors, heat cameras, voltage and current sensors, and a plurality of different other relevant sensors known to a person skilled in the art, it is possible to monitor the effects of the before mentioned simulations on the wind turbine.

Figure 6:
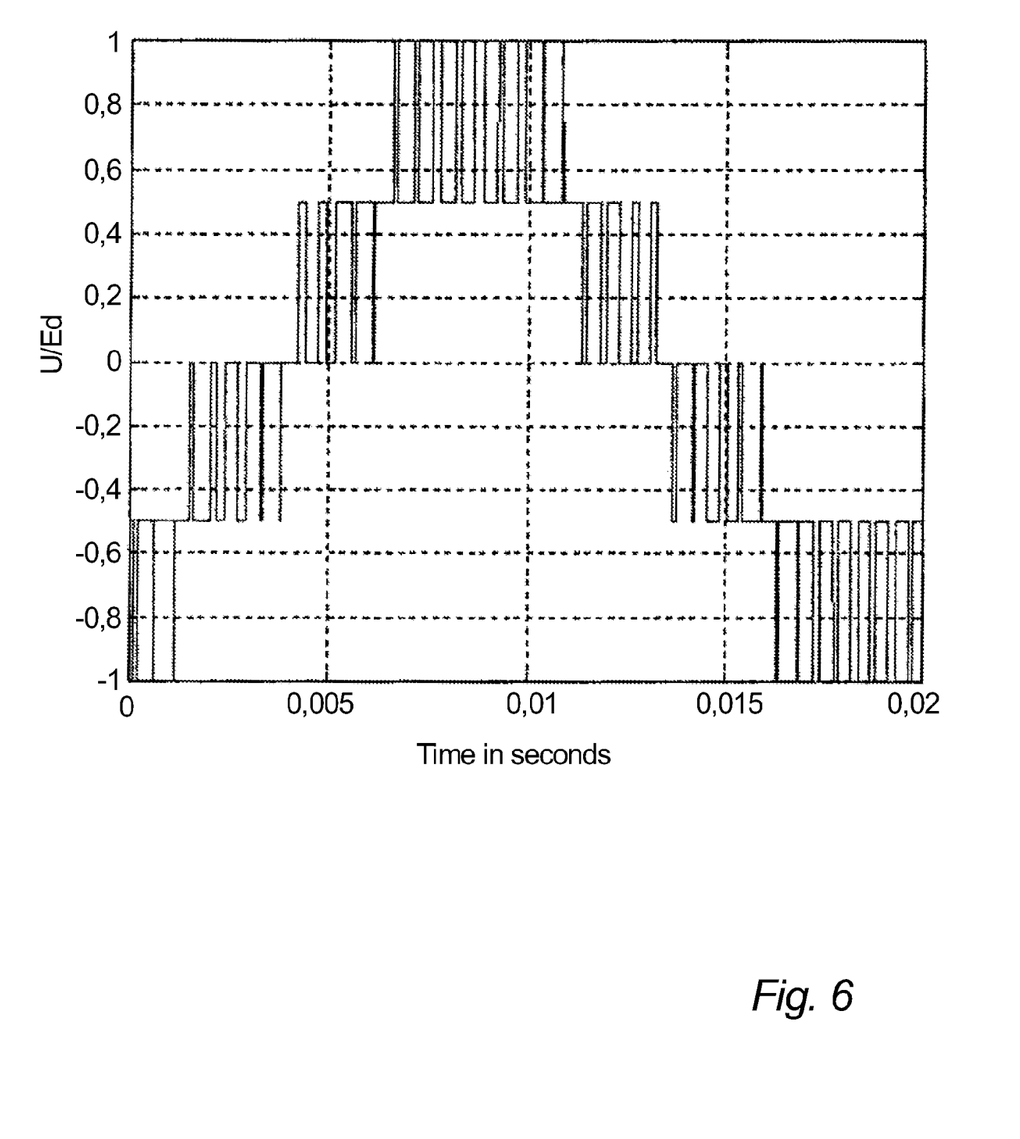
FIG. 6 illustrates a principle output of a power converter applied according to an embodiment of the invention.

FIG. 6 illustrates an exemplary output of a power converter, such as the power converter 50. The illustrated converter, an ALSPA VDM 7000 medium voltage inverter, is a multi-level converter, such as a 3-level neutral point clamped converter, thereby delivering an output having a relatively low harmonic distortion when coupled to a motor or a transformer. The illustrated output illustrates phase to phase voltage as a function of time.

Figure 7:
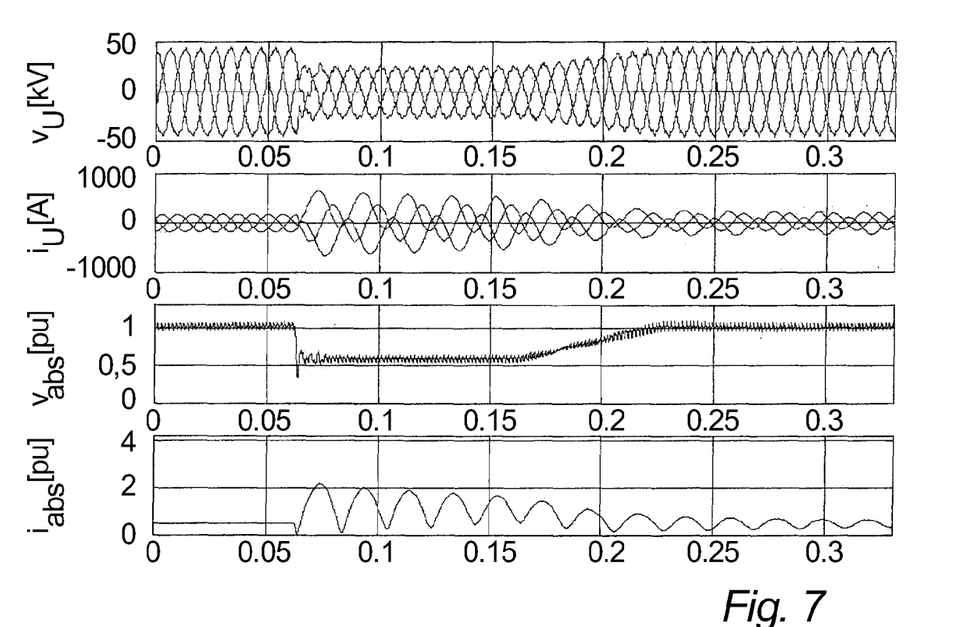
FIG. 7 illustrates a grid simulation of a voltage drop up to 60% of nominal voltage at all phases.

FIG. 7 illustrates a grid simulation of a voltage drop to 60% of nominal voltage at all phases with a configuration of 18 MVA/18 MVA installed inverter power. The two stated power values refer to the two sides of the power frequency converter, respectively.

$v_U[kV]$ designates the voltages of the different phases of the output of the grid simulating system, measured in kVolt.

$i_u[A]$ designates the currents of the different phases of the output of the grid simulating system, measured in Ampere.

$v_{abs}[pu]$ and $i_{abs}[pu]$ designate the combined absolute voltage and the combined absolute current, respectively, per unit, i.e. a value of 1 indicates 100% of nominal voltage or current of the phases of the grid simulation system.

In this simulation, the test period starts at about 0.06 seconds, and it is seen that the voltage level of the system stabilizes after about 2.3 seconds.

Figure 8:
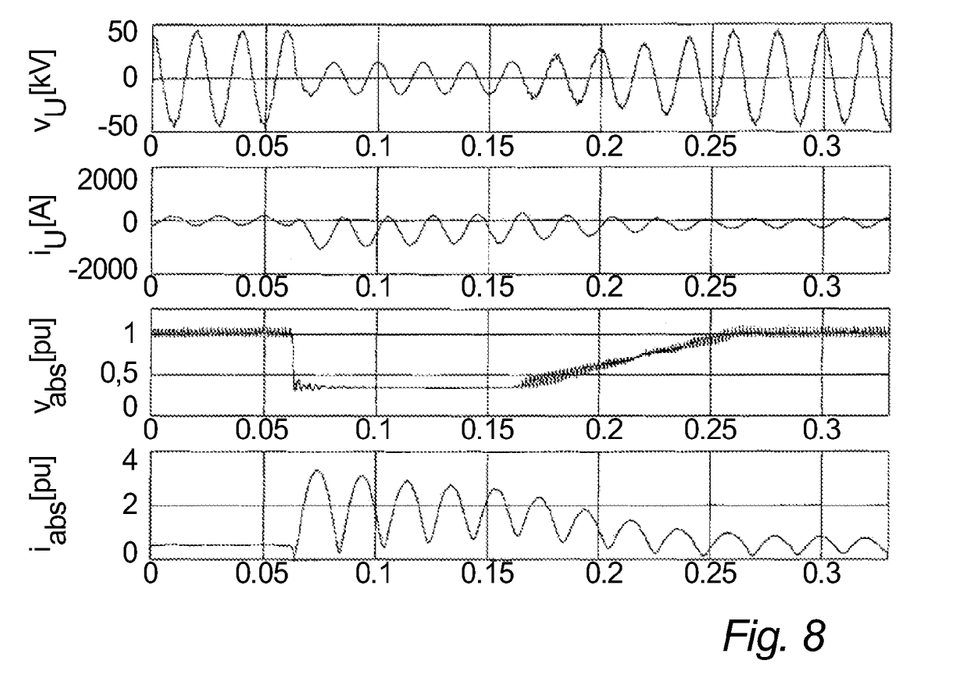
FIG. 8 illustrates a grid simulation of a three-phase short-circuit and a voltage drop to about 35% of nominal voltage.

FIG. 8 illustrates a grid simulation of a three-phase short-circuit and a voltage drop to about 35% of nominal voltage with a configuration of 18 MVA/27 MVA installed inverter power.

$v_U$[kV] designates the voltages of the different phases of the output of the grid simulating system, measured in kVolt.

$i_u$[A] designates the currents of the different phases of the output of the grid simulating system, measured in Ampere.

$v_{abs}$[pu] and $i_{abs}$[pu] designate the combined absolute voltage and the combined absolute current, respectively, per unit, i.e. a value of 1 indicates 100% of nominal voltage or current of the phases of the grid simulation system.

In this simulation, the test period starts at about 0.06 seconds, and it is seen that the voltage level of the system stabilizes after about 2.6 seconds.

Figure 9:
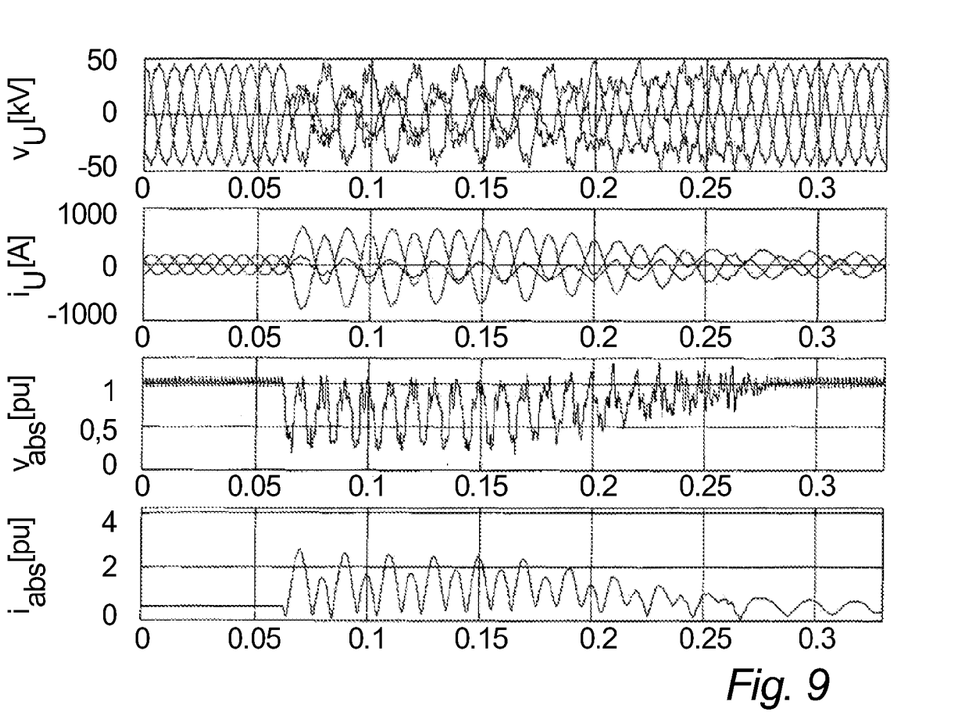
FIG. 9 illustrates a grid simulation of a two-phase fault with voltage level 100%, 0°/50%, 180°/50%, 180°.

FIG. 9 illustrates a grid simulation of a two-phase short-circuit fault with voltage level 100%, 0°/50%, 180°/50%, 180° with a configuration of 18 MVA/27 MVA installed inverter power. The two faulty phases act as return path for the current of the working phase.

$v_U$[kV] designates the voltages of the different phases of the output of the grid simulating system, measured in kVolt.

$i_u$[A] designates the currents of the different phases of the output of the grid simulating system, measured in Ampere.

$v_{abs}$[pu] and $i_{abs}$[pu] designate the combined absolute voltage and the combined absolute current, respectively, per unit, i.e. a value of 1 indicates 100% of nominal voltage or current of the phases of the grid simulation system.

In this simulation, the test period starts at about 0.06 seconds, and it is seen that the voltage level of the system stabilizes after about 2.8 seconds.

Figure 10:
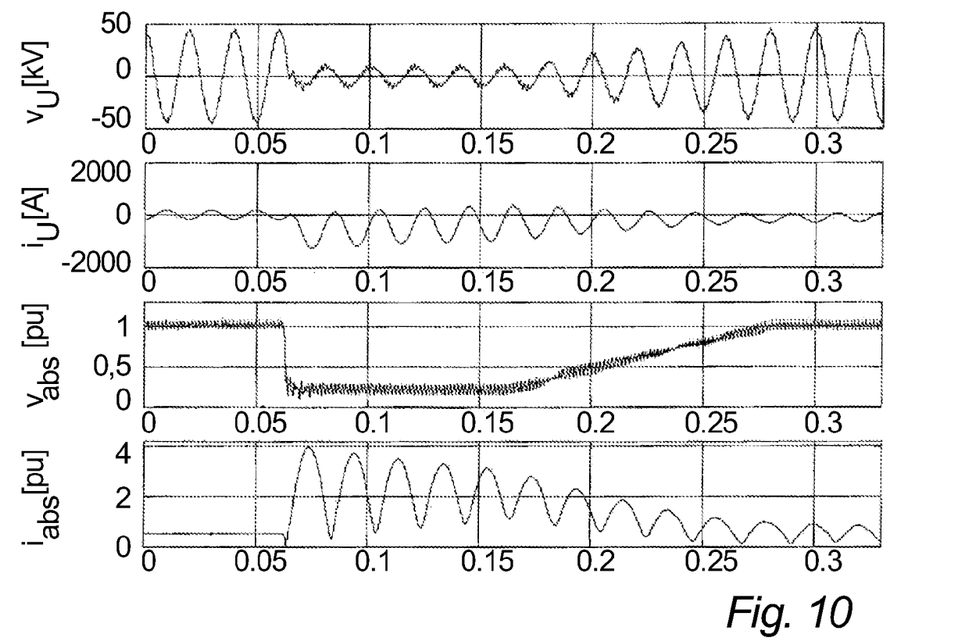
FIG. 10 illustrates a grid simulation of a voltage drop up to about 20% of nominal voltage.

FIG. 10 illustrates a grid simulation of a voltage drop up to about 20% of nominal voltage with a configuration of 18 MVA/36 MVA installed inverter power.

$v_U$[kV] designates the voltages of the different phases of the output of the grid simulating system, measured in kVolt.

$i_u$[A] designates the currents of the different phases of the output of the grid simulating system, measured in Ampere.

$v_{abs}$[pu] and $i_{abs}$[pu] designate the combined absolute voltage and the combined absolute current, respectively, per unit, i.e. a value of 1 indicates 100% of nominal voltage or current of the phases of the grid simulation system.

In this simulation, the test period starts at about 0.06 seconds, and it is seen that the voltage level of the system stabilizes after about 2.8 seconds.

What is claimed is:

1. A wind turbine testing system for testing at least a part of nacelle components of a wind turbine system including an electrical generator system, said nacelle components being mounted on a load carrying structure of a nacelle of said wind turbine system, said wind turbine testing system comprising
    a test bench being arranged to hold said load carrying structure of said wind turbine nacelle including said nacelle components,
    a grid simulation system comprising
        a power converter system and
        a simulation controller being arranged to be electrically coupled to at least one of said nacelle components and being adapted for providing
            a simulated utility grid on the basis of
            a power supply and
            at least one control signal established by said simulation controller, and
    a wind simulation system comprising
        a wind turbine shaft rotating means arranged to be coupled to a rotating part of said generator system or a generator-related system of a wind turbine nacelle or a part of a wind turbine nacelle located in said test bench.

2. The wind turbine testing system according to claim 1, wherein said test bench is arranged to hold a complete nacelle of said wind turbine system.

3. The wind turbine testing system according to claim 1, wherein said shaft rotating means comprises means for being mechanically connected to a low speed shaft of said wind turbine system.

4. The wind turbine testing system according to claim 1, wherein said shaft rotating means comprises means for being mechanically connected to a high speed shaft of said wind turbine system.

5. The wind turbine testing system according to claim 1, wherein said simulated utility grid comprises means for being electrically coupled to a generator output transformer of said nacelle components.

6. The wind turbine testing system according to claim 1, wherein said simulated utility grid comprises means for being electrically coupled to a power frequency converter of said nacelle components.

7. The wind turbine testing system according to claim 1, wherein said power converter system is arranged to simulate different grid conditions in response to control signals from said simulation controller.

8. The wind turbine testing system according to claim 7, wherein said grid conditions comprise at least one of fault conditions, weak grid conditions and asymmetric grid conditions.

9. The wind turbine testing system according to claim 7, wherein said grid conditions comprise voltage variations, short-circuits, cos(φ) variations, frequency variations of phases, current variations, curve form variations of individual, some or all phases and any combination thereof.

10. The wind turbine testing system according to claim 7, wherein said grid conditions involve time varying grid conditions.

11. The wind turbine testing system according to claim 1, wherein said power supply is provided by a utility grid.

12. The wind turbine testing system according to claim 1, wherein said power converter system comprises a switching semiconductor based converter.

13. The wind turbine testing system according to claim 12, wherein said semiconductor based converter is a thyristor based converter.

14. The wind turbine testing system according to claim 1, wherein said grid simulation system further comprises a grid input transformer coupled between said power supply and said power converter system.

15. The wind turbine testing system according to claim 1, wherein said grid simulation system further comprises a grid output transformer coupled between said power converter system and said simulated utility grid.

16. The wind turbine testing system according to claim 1 further comprising at least one of a nacelle stress simulating system, a wind turbine system temperature simulating system and a wind turbine system humidity simulating system.

17. A method of testing at least a part of nacelle components of a wind turbine system when mounted on a load carrying structure of a nacelle of said wind turbine system by means of a wind turbine testing system comprising the steps of:

mounting said nacelle components onto a load carrying structure of a wind turbine nacelle,
placing said load carrying structure in a test bench of said wind turbine testing system,
coupling a shaft rotating means of a wind simulation system of said wind turbine testing system to a rotating part of a generator system or a generator-related system of said wind turbine nacelle,
coupling a simulated utility grid of a grid simulation system of said wind turbine testing system electrically to an electrical nacelle component,
rotating said rotating part of a generator system by means of said wind simulation system simulating different wind conditions,
exposing said nacelle component to different simulated grid conditions by means of said grid simulation system, and
establishing and evaluating feedback from said nacelle components under different simultaneously simulated wind and grid conditions.

18. A method of testing at least a part of nacelle components of a wind turbine system when mounted on a load carrying structure of a nacelle of said wind turbine system by means of a wind turbine testing system comprising the steps of:
mounting said nacelle components in a wind turbine nacelle,
placing said wind turbine nacelle in a test bench of said wind turbine testing system,
coupling a shaft rotating means of a wind simulation system of said wind turbine testing system to a rotating part of a generator system or a generator-related system of said wind turbine nacelle,
coupling a simulated utility grid of a grid simulation system of said wind turbine testing system electrically to an electrical nacelle component,
rotating said rotating part of a generator system by means of said wind simulation system simulating different wind conditions,
exposing said nacelle component to different simulated grid conditions by means of said grid simulation system, and
establishing and evaluating feedback from said nacelle components under different simultaneously simulated wind and grid conditions.

19. The method according to claim 17, wherein said wind turbine testing system comprises a wind turbine testing system comprising
a test bench being arranged to hold said load carrying structure of said wind turbine nacelle including said nacelle components,
a grid simulation system comprising
a power converter system and
a simulation controller being arranged to be electrically coupled to at least one of said nacelle components and being adapted for providing
a simulated utility grid on the basis of
a power supply and
at least one control signal established by said simulation controller, and
a wind simulation system comprising
a wind turbine shaft rotating means arranged to be coupled to a rotating part of said generator system or a generator-related system of a wind turbine nacelle or a part of a wind turbine nacelle located in said test bench.

20. The method according to claim 17, wherein said simulated grid conditions include fault conditions of a utility grid.

* * * * *